United States Patent
Fisher et al.

(10) Patent No.: US 12,062,545 B2
(45) Date of Patent: Aug. 13, 2024

(54) FLUORINE-FREE TUNGSTEN ALD FOR DIELECTRIC SELECTIVITY IMPROVEMENT

(71) Applicant: Applied Materials, Inc., Santa Clara, CA (US)

(72) Inventors: Ilanit Fisher, San Jose, CA (US); Chi-Chou Lin, San Jose, CA (US); Kedi Wu, Fremont, CA (US); Wen Ting Chen, San Jose, CA (US); Shih Chung Chen, Cupertino, CA (US); Srinivas Gandikota, Santa Clara, CA (US); Mandyam Sriram, San Jose, CA (US); Chenfei Shen, San Jose, CA (US); Naomi Yoshida, Sunnyvale, CA (US); He Ren, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 261 days.

(21) Appl. No.: 17/339,454

(22) Filed: Jun. 4, 2021

(65) Prior Publication Data
US 2021/0384036 A1    Dec. 9, 2021

Related U.S. Application Data

(60) Provisional application No. 63/034,721, filed on Jun. 4, 2020.

(51) Int. Cl.
| | | |
|---|---|---|
| *H01L 21/285* | (2006.01) | |
| *C23C 16/02* | (2006.01) | |
| *C23C 16/04* | (2006.01) | |
| *C23C 16/14* | (2006.01) | |
| *C23C 16/455* | (2006.01) | |
| *H01L 21/02* | (2006.01) | |

(52) U.S. Cl.
CPC .... *H01L 21/28568* (2013.01); *C23C 16/0227* (2013.01); *C23C 16/04* (2013.01); *C23C 16/14* (2013.01); *C23C 16/45553* (2013.01); *H01L 21/02068* (2013.01)

(58) Field of Classification Search
None
See application file for complete search history.

(56) References Cited

U.S. PATENT DOCUMENTS

| | | |
|---|---|---|
| 7,144,809 B2 | 12/2006 | Elers et al. |
| 9,240,347 B2 | 1/2016 | Chandrashekar et al. |
| (Continued) | | |

FOREIGN PATENT DOCUMENTS

| | | |
|---|---|---|
| JP | 2016145409 A | 8/2016 |

OTHER PUBLICATIONS

PCT International Search Report and Written Opinion in PCT/US2021/035865 dated Sep. 27, 2021, 10 pages.

(Continued)

*Primary Examiner* — Cory W Eskridge
(74) *Attorney, Agent, or Firm* — Servilla Whitney LLC

(57) ABSTRACT

Methods of forming metallic tungsten films selectively on a conductive surface relative to a dielectric surface are described. A substrate is exposed to a first process condition to deposit a tungsten-containing film that is substrate free of tungsten metal. The tungsten-containing film is then converted to a metallic tungsten film by exposure to a second process condition.

13 Claims, 3 Drawing Sheets

(56) References Cited

U.S. PATENT DOCUMENTS

| | | |
|---|---|---|
| 2003/0190423 A1 | 10/2003 | Yang et al. |
| 2006/0009034 A1 | 1/2006 | Lai et al. |
| 2006/0019495 A1 | 1/2006 | Marcadal et al. |
| 2011/0244680 A1 | 10/2011 | Tohnoe et al. |
| 2014/0106083 A1 | 4/2014 | Wu et al. |
| 2014/0120723 A1* | 5/2014 | Fu .......................... C23C 16/14 |
| | | 438/680 |
| 2014/0273451 A1 | 9/2014 | Wang et al. |
| 2015/0325475 A1* | 11/2015 | Bamnolker ............. C23C 16/52 |
| | | 438/680 |
| 2016/0233099 A1* | 8/2016 | Narushima ....... H01L 21/28562 |
| 2017/0148670 A1 | 5/2017 | Lei et al. |
| 2018/0240676 A1 | 8/2018 | Chan et al. |
| 2019/0148224 A1 | 5/2019 | Kuroda et al. |
| 2019/0164752 A1* | 5/2019 | Chi ................... H01L 21/32051 |

OTHER PUBLICATIONS

Non-Final Office Action in U.S. Appl. No. 17/225,667 dated Feb. 16, 2023, 10 pages.
Final Office Action in U.S. Appl. No. 17/225,667 dated Sep. 13, 2023, 11 pages.

\* cited by examiner

FLUORINE-FREE TUNGSTEN ALD FOR DIELECTRIC SELECTIVITY IMPROVEMENT

CROSS-REFERENCE TO RELATED APPLICATIONS

This application claims priority to U.S. Provisional Application No. 63/034,721, filed Jun. 4, 2020, the entire disclosure of which is hereby incorporated by reference herein.

TECHNICAL FIELD

Embodiments of the disclosure pertain to the field of electronic device manufacturing, and in particular, to an integrated circuit (IC) manufacturing. In particular, embodiments of the disclosure pertain to methods for filling surface structures with a metal film.

BACKGROUND

Integrated circuits are made possible by processes that produce intricately patterned material layers on substrate surfaces. Producing patterned material on a substrate requires controlled methods for deposition of desired materials. Selectively depositing a film on one surface relative to a different surface is useful for patterning and other applications.

Conventional methods for metal deposition frequently suffer from poor selectivity to dielectric surfaces. Additionally, single wafer process environments can suffer from low throughput for atomic layer deposition (ALD) processes.

In high-k metal gates with FINFET schemes, the features that need to be filled are getting extremely small as the technology node goes to 14 nm and below. Tungsten hexafluoride ($WF_6$) based chemical vapor deposition (CVD)/ALD tungsten films introduce fluorine and cannot be directly deposited on the gate without a barrier layer and a nucleation layer. As the dimension shrinks, the barrier layer and nucleation layers occupy most of volume in narrow feature. The high resistivities of these films impact the performance of the resultant device.

Therefore, a need exists for improved methods for selective metal deposition.

SUMMARY

One or more embodiments of the disclosure are directed to methods of processing a substrate. A substrate surface is exposed to a first process condition comprising a flow of a fluorine-free tungsten precursor and a flow of a first reducing agent to form a tungsten-containing film on the substrate surface. The tungsten-containing film is substantially free of tungsten metal. The tungsten-containing film is exposed to a second process condition comprising a flow of a second reducing agent to reduce the tungsten-containing film on the substrate surface to a metallic tungsten film.

Additional embodiments of the disclosure are directed to methods of forming a metallic tungsten film. A tungsten-containing film that is substantially free of tungsten metal is formed on a substrate. The substrate has a conductive surface and a dielectric surface and the tungsten-containing film forms selectively on the conductive surface relative to the dielectric surface. The tungsten-containing film is formed by exposing the substrate to a first process condition comprising a flow of fluorine-free tungsten precursor and a flow of a first reducing agent. The fluorine-free tungsten precursor and the first reducing agent having a flow rate ratio in the range of 10:1 to 1:2.5. The tungsten-containing film is converted to a metallic tungsten film by exposing the substrate with the tungsten-containing film that is substantially free of tungsten metal to a second process condition comprising a flow of a second reducing agent.

Further embodiments of the disclosure are directed to methods of forming metallic tungsten films. A substrate having a dielectric surface and a conductive surface is sequentially exposed to a first process condition and a second process condition to deposit a metallic tungsten film selectively on the conductive surface. The first process condition comprises a flow of fluorine-free tungsten precursor and a flow of a first reducing agent to form a tungsten-containing film on the conductive surface. The tungsten-containing film is substantially free of tungsten metal. The second process condition comprises a flow of a second reducing agent to reduce the tungsten-containing film on the conductive surface to a metallic tungsten film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

Figure 1:
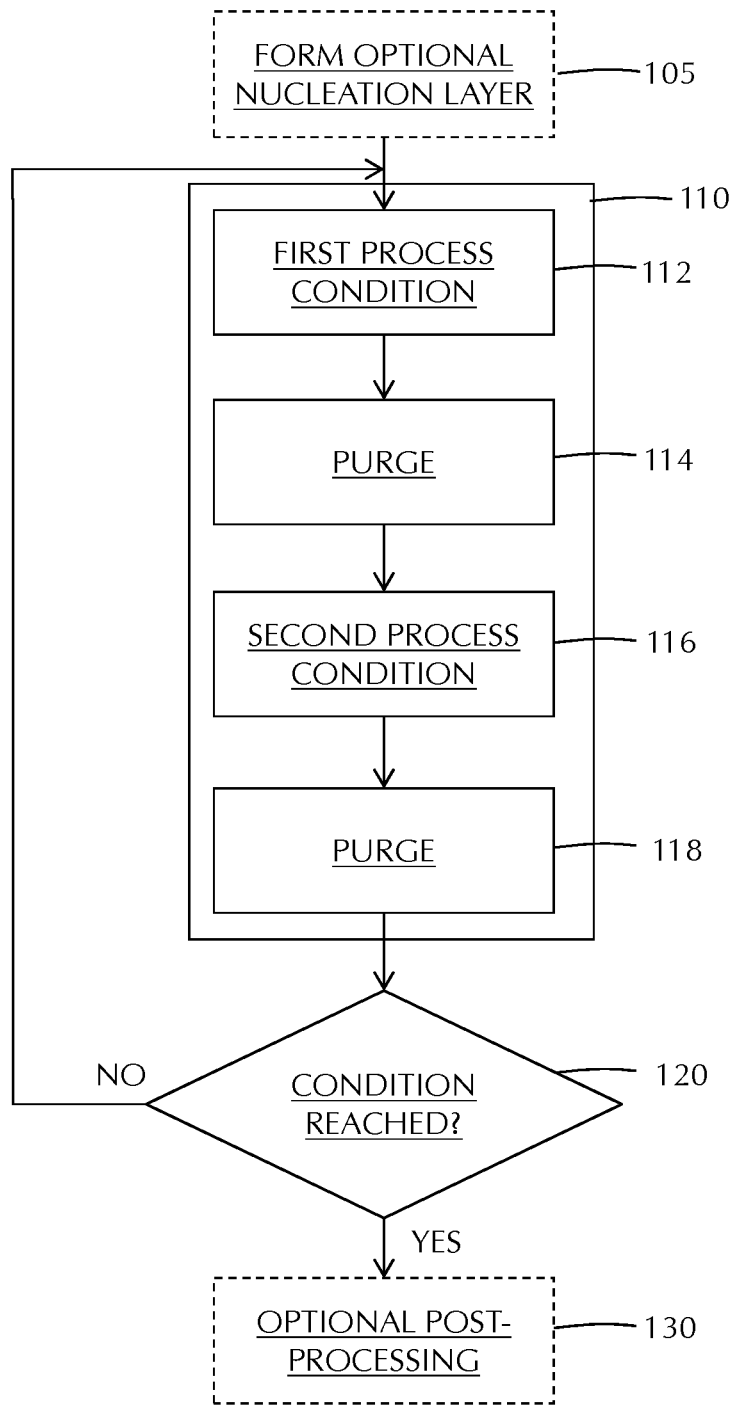
FIG. 1 shows an exemplary process method according to one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

As used herein, the term "liner" refers to a layer conformably formed along at least a portion of the sidewalls and/or lower surface of an opening such that a substantial portion of the opening prior to the deposition of the layer remains unfilled after deposition of the layer. In some embodiments, the liner may be formed along the entirety of the sidewalls and lower surface of the opening.

One or more embodiments of the disclosure are directed to high selectivity deposition processes. Some embodiments have high deposition rates for metal fill applications. Some embodiments use fluorine-free metal precursors to increase selectivity and deposition rate. Some embodiments incorporate a reducing agent in the first ALD step to increase the selectivity relative to dielectrics and increase the deposition rate with comparable film performance (e.g., step coverage, gap filling). Some embodiments provide high selectivity fluorine-free tungsten deposition with high throughput ALD processes.

Some embodiments of the disclosure provide atomic layer deposition methods incorporating a reducing agent in the first ALD step. Without being bound by any particular theory of operation, it is believed that the inclusion of the reducing agent enables the precursor to thermally decompose into different derivatives of the precursor with significantly greater precursor reduction in the main reducing ALD step.

One or more embodiments of the disclosure incorporate different gases (e.g., $H_2$, $SiH_4$, $Si_2H_6$, $Si_4H_{10}$, $NH_3$) into the metal (e.g., tungsten (W)) precursor dose. In some embodiments, the incorporation of a reducing agent improves the selectivity of the metal deposition relative to dielectrics and accelerates the rate of metal reduction.

ALD Fluorine-Free Tungsten (FFW) in some embodiments replaces and/or reduces traditional high resistivity nucleation layers (e.g., $SiH_4$ or $B_2H_6$ ALD W 20-30 Å) and thick fluorine barrier (e.g., TiN 30-50 Å). In some embodiments, FFW has low resistivity, excellent step coverage, superior fluorine barrier property, and can integrate with conventional $WF_6$ based bulk W fill. Some embodiments improve throughput while maintaining acceptable film performance or other metrics (e.g., non-uniformity, step coverage, particles).

One or more embodiments of the disclosure are directed to methods with high deposition rate FFW films. A small coflow of a reducing agent, like $H_2$, $SiH_4$, $Si_2H_6$, $Si_4H_{12}$, $NH_3$, is added to the W precursor ALD dose step. In some embodiments, the growth of FFW with a hydrogen ($H_2$) coflow by ALD occurs at a suitable temperature (e.g., ranging from 400° C. to 550° C., or form 460° C. to 475° C.).

The tungsten precursor for growing FFW includes, but is not limited to, tungsten chloride and hydrogen as reducing agent. In some embodiments, FFW is grown on a conductive layer (e.g., TiN or TiAl films). In one or more embodiments, the ALD process includes: exposure to a W precursor dose with 50-500 sccm of $H_2$ coflow, W precursor purge, $H_2$ dose, $H_2$ purge. Argon (Ar) or other suitable inert gas is used for precursor carrier and purging in some embodiments.

In some embodiments, the deposition rate of the FFW is increased 2× or more on TiN and TiAl films. In some embodiments, the film throughput is increased due to increased deposition rate of the FFW. In some embodiments, an FFW nucleation layer is deposited followed by high deposition rate FFW in same chamber without air break.

In one or more embodiments, the small amount of reducing agent ($H_2$) with W precursor does not show any CVD W film growth. Without being bound by any particular theory of operation, it is believed that without enough reducing agent, the W precursor is not reduced completely to metallic W. It is further believed that with small amount of reductant, some of W precursor reduces to different W precursor derivatives that are less reactive and are not readily reduced to metallic W with low $H_2$ flow. The tungsten precursor derivatives deposited on the substrate surface is reduced to metallic tungsten.

Figure 2:
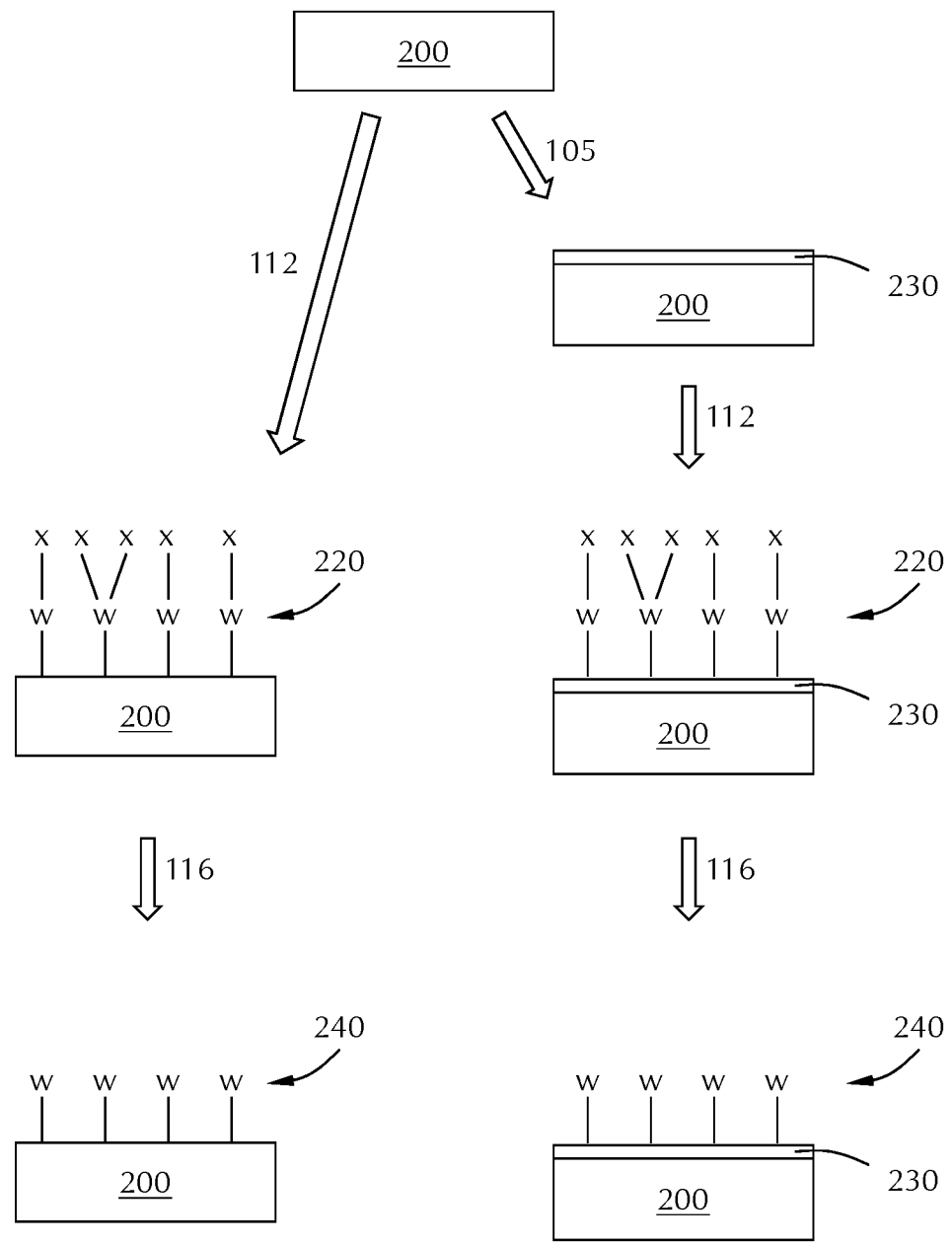
FIG. 2 shows a cross-sectional schematic view of a semiconductor device during a process method in accordance with one or more embodiment of the disclosure.
Figure 3:
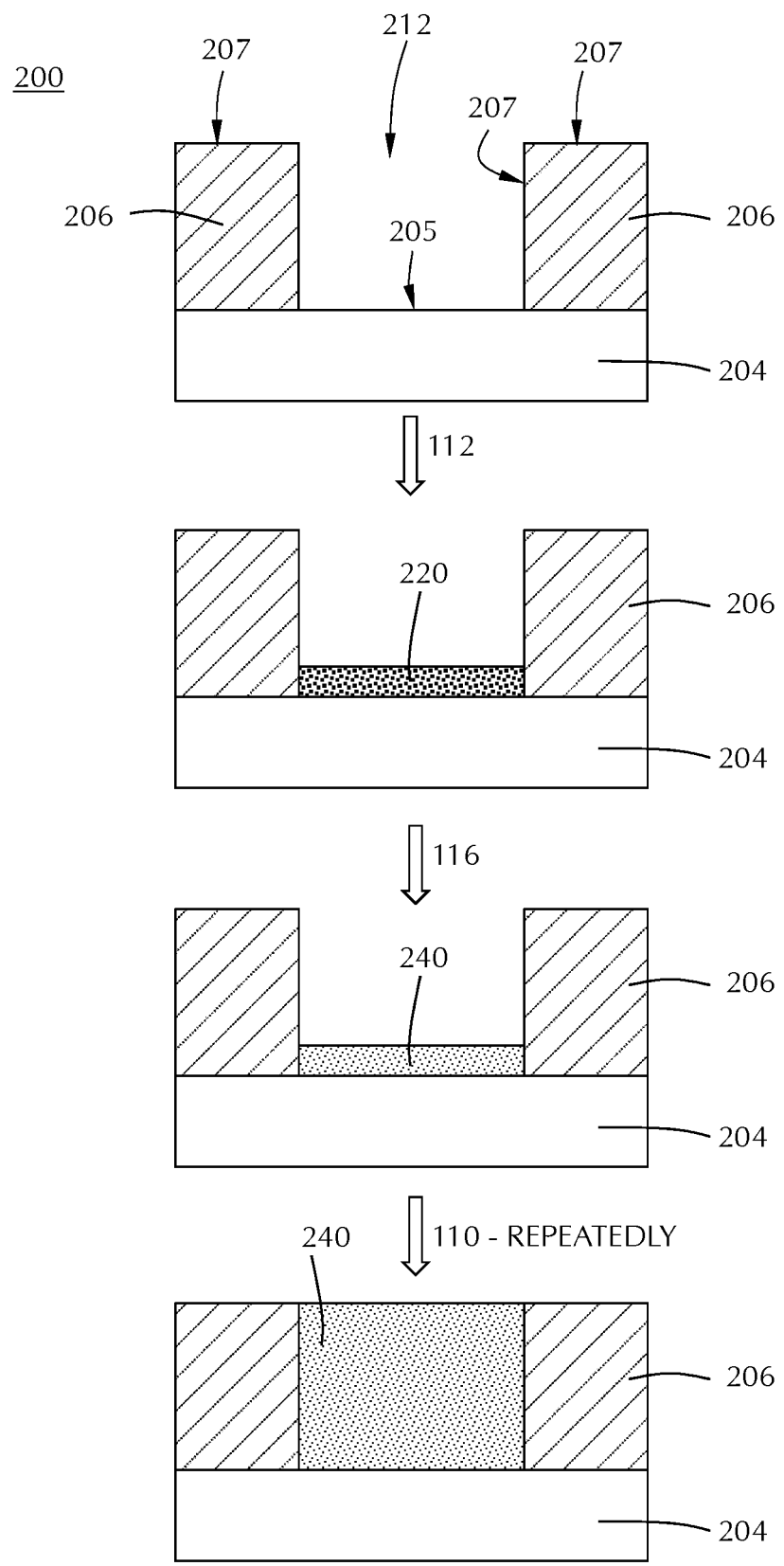
FIG. 3 shows a cross-sectional schematic view of a semiconductor device during a process method in accordance with one or more embodiment of the disclosure.

Referring to FIGS. 1 through 3, one or more embodiments of the disclosure are directed to methods 100 for depositing metal films 240. FIG. 2 illustrates the method 100 depositing a metal file 240 on a surface 202 of a substrate 200; for example, a blanket deposition process.

FIG. 3 illustrates a selective deposition process in which the metal film 240 is deposited on one surface preferentially relative to a second surface. The substrate 200 illustrated in FIG. 3 includes a first material (conductive material 204) with a first surface (conductive surface 205) and a second material (dielectric material 206) with a second surface (dielectric surface 207).

FIG. 3 shows a substrate 200 with a surface structure 212 formed therein. The surface structure 212 can be any suitable structure (e.g., a via or trench). In the embodiment shown, the structure 212 has a bottom formed by the conductive surface 205 and sidewalls formed by the dielectric surface 207. FIG. 3 shows a substrate having a single feature for illustrative purposes; however, those skilled in the art will understand that there can be more than one feature. The shape of the feature can be any suitable shape including, but not limited to, peaks, trenches and cylindrical vias. In specific embodiments, the feature is a trench. In other specific embodiments, the feature is a via. As used in this regard, the term "feature" means any intentional surface irregularity. Suitable examples of features include, but are not limited to trenches which have a top, two sidewalls and a bottom, peaks which have a top and two sidewalls extending upward from a surface, and vias which have sidewalls extending down from a surface with an open bottom. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1. In one or more embodiments the aspect ratio is greater than 10:1.

The method 100 includes an atomic layer deposition (ALD) process 110 comprising four sub-processes. The skilled artisan will recognize that more or less than four sub-processes can be included in the ALD process 110 and the disclosure is not limited to the process illustrated. The ALD process 110 illustrated in FIG. 3 sequentially exposes a substrate having a dielectric surface 207 and a conductive surface 205 to a first process condition 112 and a second process condition 116 to deposit a metallic tungsten film 240 selectively on the conductive surface 205.

In method 100, the substrate 200 is exposed to a first process condition in process 112. The first process condition comprises a flow of a fluorine-free tungsten precursor and a flow of a first reducing agent to form a tungsten-containing film 220 on the substrate surface 202. FIG. 3 illustrates the formation of the tungsten-containing film 220 on the surface of the first material (conductive surface 205 of conductive material 204).

The tungsten-containing film 220 is substantially free of tungsten metal. As used in this manner, the term "tungsten metal" refers to zero valent tungsten atoms in the tungsten-containing film 220. As used in this manner, the term "substantially free of tungsten metal" means that less than or equal to 5%, 2%, 1% or 0.5% of the tungsten atoms in the tungsten-containing film 220 are zero valent tungsten atoms.

In some embodiments, the first process condition comprises a fluorine free tungsten precursor. In some embodiments, the fluorine-free tungsten precursor comprises or consists essentially of a tungsten halide. As used in this specification and the appended claims, the term "consists essentially of" means that the active (or reactive) species comprises greater than or equal to 95%, 98%, 99% or 99.5% of the stated species on a molar basis. In some embodiments, the tungsten halide comprises one or more of tungsten pentachloride ($WCl_5$) or tungsten hexachloride ($WCl_6$). In some embodiments, the fluorine-free tungsten precursor comprises a tungsten oxy-halide precursor, such as $WOCl_4$ or $WO_2Cl_2$. In other embodiments, the first process condition comprises a tungsten precursor selected from the group consisting of fluorine free tungsten halide precursors or chlorine-free tungsten halide precursors, such as tungsten pentabromide ($WBr_5$) or tungsten hexabromide ($WBr_6$).

The first process condition includes a first reducing agent that is reactive with the tungsten precursor. The first reducing agent (also referred to as a first reductant) comprises a reactive gas, such as a hydrogen-containing gas, such as hydrogen ($H_2$) or ammonia ($NH_3$) or hydrazine $N_2H_4$), and a carrier gas, such as argon (Ar), helium (He), or nitrogen ($N_2$). In some embodiments, the carrier gas is an inert gas. In some embodiments, the first gas consists of, or consists essentially of, a metallic tungsten precursor gas, a reactant gas, and a carrier gas. In some embodiments, the first gas consists of, or consists essentially of a chlorine-free, fluorine-free tungsten halide precursor, a hydrogen containing gas, and an inert gas. In some embodiments, the method of claim 1, wherein the first reducing agent comprises one or more of hydrogen ($H_2$), silane ($SiH_4$), disilane ($Si_2H_6$), trisilane ($Si_3H_8$), tetrasilane ($Si_4H_{10}$) or ammonia ($NH_3$).

The tungsten precursor of some embodiments is flowed into the process region of the processing chamber in a carrier gas. For solid or liquid precursors, the precursors of some embodiments are held in an ampoule and a flow of carrier gas passes through the ampoule and brings precursor along. In some embodiments, the carrier gas comprises an inert gas. In some embodiments, the carrier gas comprises or consists essentially of one or more of helium, neon, argon, nitrogen, krypton or xenon. As used herein, the flow rate of the metal precursor is the flow rate of the carrier gas including the metal precursor.

The total flow into the process region of the processing chamber according to some embodiments is the combined flow rates of the metal precursor and the first reducing agent. In some embodiments, a make-up gas is flowed into the process region and the metal precursor and the first reducing agent are added to the make-up gas flow stream. In some embodiments, the make-up gas flow stream is at a much larger flow rate than either the metal precursor or the first reducing agent. In some embodiments, the make-up gas flow stream has a flow rate greater than 10× the higher of the precursor flow or the first reducing agent flow.

In some embodiments, the flow rates of the tungsten precursor and the first reducing agent are configured to provide a tungsten-containing film substantially free of tungsten metal. In some embodiments, the first reducing agent has a flow rate in the range of 50 to 500 sccm. As will be understood by the skilled artisan, the flow rate of a make-up gas does not change the ratio of the tungsten precursor to the first reducing agent. The make-up gas flow can change the overall concentration of the tungsten precursor and/or the first reducing agent.

In some embodiments, the first process condition has a flow rate of the first reducing agent is in the range of 5% to 70% of a flow rate of the fluorine-free tungsten precursor.

In some embodiments, the fluorine-free tungsten precursor and the first reducing agent having a flow rate ratio in the range of 10:1 to 1:2.5.

The dielectric material 206 and the dielectric surface 207 of the dielectric material 206, comprises any suitable dielectric material. In some embodiments, the dielectric material 206 and the dielectric surface 207 comprises one or more of silicon nitride, silicon oxide.

The conductive material 204 and the conductive surface 205 of the conductive material 204, comprises any suitable conductive material. In some embodiments, the conductive material 204 and the conductive surface 205 of the conductive material 204 comprises one or more of titanium nitride, titanium aluminum, aluminum or titanium.

In some embodiments, the method 100 includes a purge process 114 as part of the ALD process 110. The purge process 114 can be any suitable purge process that removes unreacted metal precursor or first reducing agent from the process region of the process chamber. In some embodiments, the purge process 114 comprises flowing the same inert gas that is used as the carrier gas for the metal precursor.

Method 100 includes exposure to a second process condition 116 as part of the ALD process 110. The second process condition 116 is configured to reduce the tungsten-containing film 220 on the substrate surface to a metallic tungsten film 240. Stated differently, in some embodiments, the tungsten-containing film 220 is converted to a metallic tungsten film 240 by exposing the tungsten-containing film 220 that is substantially free of tungsten metal to a second process condition comprising a flow of a second reducing agent.

In some embodiments, the second process condition comprises a second reducing agent. In some embodiments, the second reducing agent is the same species as the first reducing agent. In some embodiments, the second reducing agent is a different species as the first reducing agent. The concentration of the second reducing agent can be the same or different from the first reducing agent concentration.

In some embodiments, the second reducing agent comprises one or more of hydrogen ($H_2$), silane ($SiH_4$), disilane ($Si_2H_6$), trisilane ($Si_3H_8$), tetrasilane ($Si_4H_{10}$) or ammonia ($NH_3$).

In some embodiments, the method 100 includes a purge process 118 as part of the ALD process 110. The purge process 118 can be any suitable purge process that removes unreacted metal precursor or first reducing agent from the process region of the process chamber. In some embodiments, the purge process 118 comprises flowing the same inert gas that is used as the carrier gas for the metal precursor. In some embodiments, the purge process 118 comprises flowing the same inert gas as the purge process 114. In some embodiments, the inert gas used as the carrier gas for the metal precursor, a carrier/diluent gas for the reducing agent (if there is one), the make-up gas and the purge gas comprise the same species.

In some embodiments, as illustrated in FIG. 3, the metallic tungsten film 240 is formed selectively on the conductive surface 205 over the dielectric surface 207. In some embodiments, the metallic tungsten film 240 fills the structure 212 in a gap fill process (as shown in FIG. 3).

The metallic tungsten film 240 of some embodiments deposits at a rate greater than or equal to twice a deposition rate of a substantially similar process without the first reducing agent in the first process condition.

The substrate 200 temperature of some embodiments is maintained throughout the ALD process 110. In some embodiments, the substrate 200 temperature is maintained at a temperature in the range of 400° C. to 550° C. during the first process condition 112 and the second process condition 116. In some embodiments, the substrate 200 temperature during the ALD process 110 is maintained in the range of 400° C. to 550° C., or 425° C. to 525° C., or 450° C. to 500° C.

In some embodiments, as shown in method 100 and in FIG. 2, an optional nucleation layer 230 is formed on the substrate surface 202 prior to exposure to the first process condition 212. In some embodiments, the substrate surface 202 is not exposed to air between formation of the nucleation layer 230 and the first process condition 212.

In other embodiments, metal precursor may form another suitable metal film. Suitable metal films include, but are not limited to, films including one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), iridium (Ir), or any combination thereof. The metal precursor selected for the other metal films of some embodiments comprises or consists essentially of a fluorine-free metal halide.

After completion of the ALD process 110, decision point 120 is examined as part of method 100 of some embodiments. If the metallic tungsten film 240 deposited has reached a predetermined thickness or a predetermined number of ALD cycles, the method 100 ends or moves to an optional post-deposition process 130. If the predetermined condition(s) have not been met, the method 100 repeats the ALD process 110.

In some embodiments, post-deposition process 130 comprises an annealing process.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A method comprising:
exposing a substrate surface with a structure formed thereon to a first process condition, the structure having a bottom and sidewall, the bottom of the structure comprising a conductive surface and the sidewall of the structure comprising a dielectric surface, the first process comprising a flow of fluorine-free tungsten precursor and a flow of a first reducing agent to form a tungsten-containing film selectively on the conductive surface relative to the dielectric surface on the substrate surface, the tungsten-containing film being substantially free of tungsten metal, the first reducing agent having a flow rate in the range of 5% to 70% of a flow rate of the fluorine-free tungsten precursor;
exposing the tungsten-containing film to a second process condition comprising a flow of a second reducing agent to reduce the tungsten-containing film on the substrate surface to a metallic tungsten film; and
filling the structure with metallic tungsten using a tungsten hexafluoride based bulk tungsten deposition.

2. The method of claim 1, wherein the fluorine-free tungsten precursor consists essentially of tungsten halide.

3. The method of claim 1, wherein the fluorine-free tungsten precursor comprises one or more of tungsten pentachloride ($WCl_5$) or tungsten hexachloride ($WCl_6$).

4. The method of claim 1, wherein the first reducing agent comprises one or more of hydrogen ($H_2$), silane ($SiH_4$), disilane ($Si_2H_6$), trisilane ($Si_3H_8$), tetrasilane ($Si_4H_{10}$) or ammonia ($NH_3$).

5. The method of claim 1, wherein the second reducing agent comprises one or more of hydrogen ($H_2$), silane ($SiH_4$), disilane ($Si_2H_6$), trisilane ($Si_3H_8$), tetrasilane ($Si_4H_{10}$) or ammonia ($NH_3$).

6. The method of claim 1, wherein the first reducing agent and the second reducing agent comprise the same reactive species.

7. The method of claim 1, wherein the first reducing agent has a flow rate in the range of 50 to 500 sccm.

8. The method of claim 1, wherein the dielectric surface comprises one or more of silicon nitride, silicon oxide.

9. The method of claim 1, wherein the conductive surface comprises one or more of titanium nitride, titanium aluminum, aluminum or titanium.

10. The method of claim 1, further comprising purging between the first process condition and the second process condition.

11. The method of claim 1, wherein the metallic tungsten film deposits at a rate greater than or equal to twice a deposition rate of a substantially similar process without the first reducing agent in the first process condition.

12. The method of claim 1, wherein the substrate surface is maintained at a temperature in the range of 400° C. to 550° C. during the first process condition and the second process condition.

13. The method of claim 1, further comprising forming a nucleation layer on the substrate surface prior to exposure to the first process condition, and the substrate surface is not exposed to air between formation of the nucleation layer and the first process condition.

* * * * *